(12) United States Patent
Eapen et al.

(10) Patent No.: US 9,515,860 B2
(45) Date of Patent: Dec. 6, 2016

(54) WIDEBAND AND NARROWBAND RECEIVER

(71) Applicant: Hughes Network Systems, LLC, Germantown, MD (US)

(72) Inventors: George Eapen, Boyds, MD (US); Yong Kang Yuan, Germantown, MD (US); Emanuel Harrington, Bowie, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/585,702

(22) Filed: Dec. 30, 2014

(65) Prior Publication Data

US 2016/0191285 A1    Jun. 30, 2016

(51) Int. Cl.
| | |
|---|---|
| *H04L 27/06* | (2006.01) |
| *H04L 27/22* | (2006.01) |
| *H04L 27/34* | (2006.01) |
| *H03M 1/12* | (2006.01) |
| *H04B 7/185* | (2006.01) |

(52) U.S. Cl.
CPC ............... *H04L 27/22* (2013.01); *H03M 1/12* (2013.01); *H04B 7/18517* (2013.01); *H04L 27/345* (2013.01)

(58) Field of Classification Search
CPC .... H04L 27/22; H04L 27/135; H04L 27/3809; H04B 1/30; H04B 7/18517; H03M 1/12; H03M 1/185
See application file for complete search history.

(56) References Cited

U.S. PATENT DOCUMENTS

| | | | | |
|---|---|---|---|---|
| 5,926,513 A | * | 7/1999 | Suominen | H03J 3/08 375/346 |
| 6,334,051 B1 | * | 12/2001 | Tsurumi | H03D 7/166 375/316 |
| 2004/0058661 A1 | * | 3/2004 | Hsu et al. | 455/311 |
| 2004/0102172 A1 | * | 5/2004 | Hendin | H04B 1/005 455/302 |
| 2004/0162048 A1 | | 8/2004 | Milbar | |
| 2005/0147192 A1 | * | 7/2005 | Yamamoto | H04B 1/1036 375/345 |

(Continued)

OTHER PUBLICATIONS

International Search Report and the Written Opinion for International App No. PCT/US2015/067837, mailed Apr. 15, 2016, European Patent Office.

*Primary Examiner* — Syed Haider
(74) *Attorney, Agent, or Firm* — Sheppard Mullin Richter & Hampton LLP

(57) ABSTRACT

Systems and methods provide a receiver design capable of both wideband (high symbol rate) and narrowband (low symbol rate) operations requirements without compromising narrowband performance. Moreover, such a receiver design can be very low cost, and eschewing the need for any expensive and/or specialized elements. A receiver configured in accordance with various embodiments utilizes a fully integrated tuner in which narrowband filters are configured to be bypassable when in wideband (high symbol rate) mode in favor of fixed wideband filters. Additionally, an analog-to-digital converter (ADC) can be implemented with digital gain for wideband operation, as well as digital data bit mapping to accommodate industry standard application-specific integrated circuits (ASICs) interfaces, such as from a 12 bit ADC core to an 8 bit digital interface.

22 Claims, 7 Drawing Sheets

(56) References Cited

U.S. PATENT DOCUMENTS

| | | | |
|---|---|---|---|
| 2006/0133551 A1* | 6/2006 | Davidoff | H03H 17/0294 375/350 |
| 2006/0154628 A1* | 7/2006 | Mochizuki | H04B 1/1027 455/134 |
| 2006/0264191 A1 | 11/2006 | Lai | |
| 2007/0081615 A1* | 4/2007 | Khoini-Poorfard et al. | 375/345 |
| 2011/0216810 A1* | 9/2011 | Kumar | 375/146 |

* cited by examiner

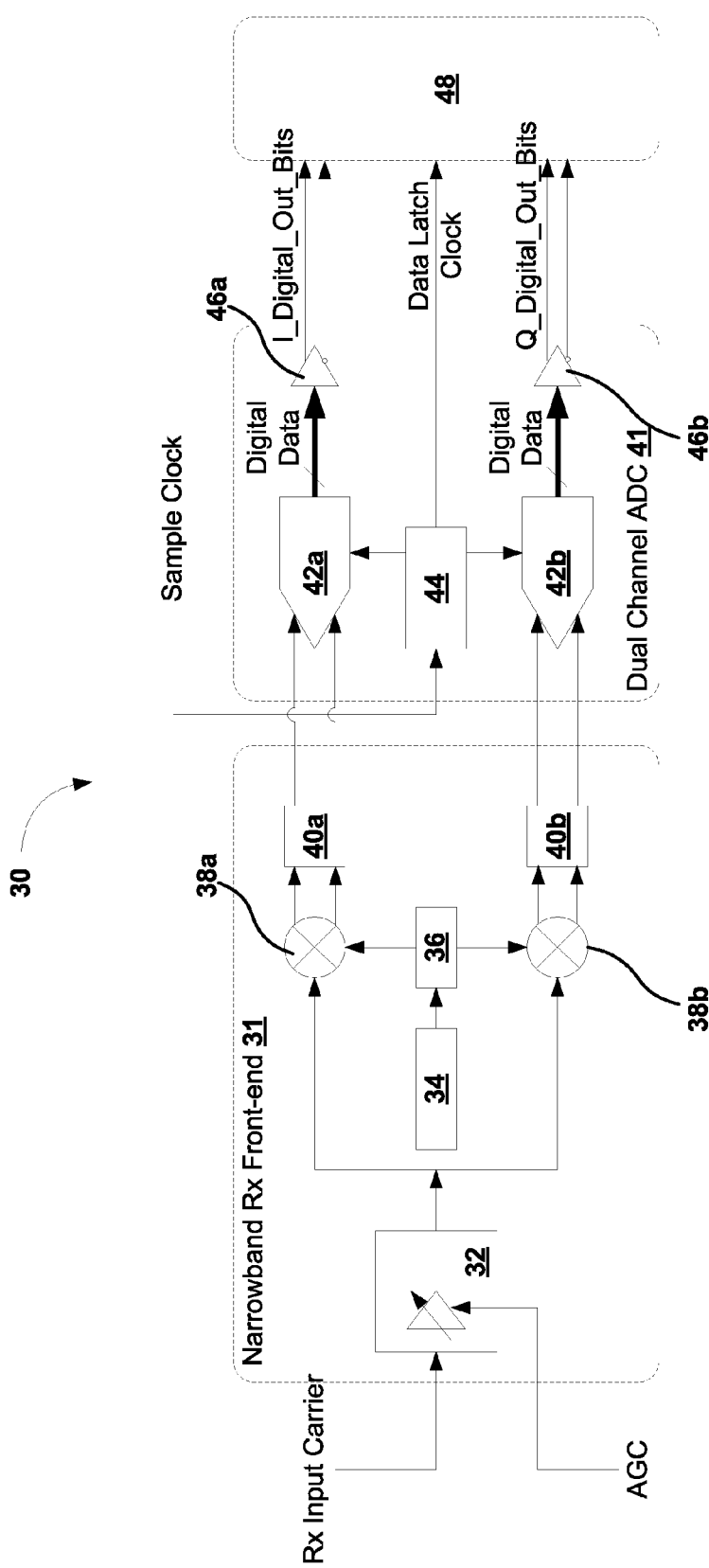
FIG. 3
(Conventional)

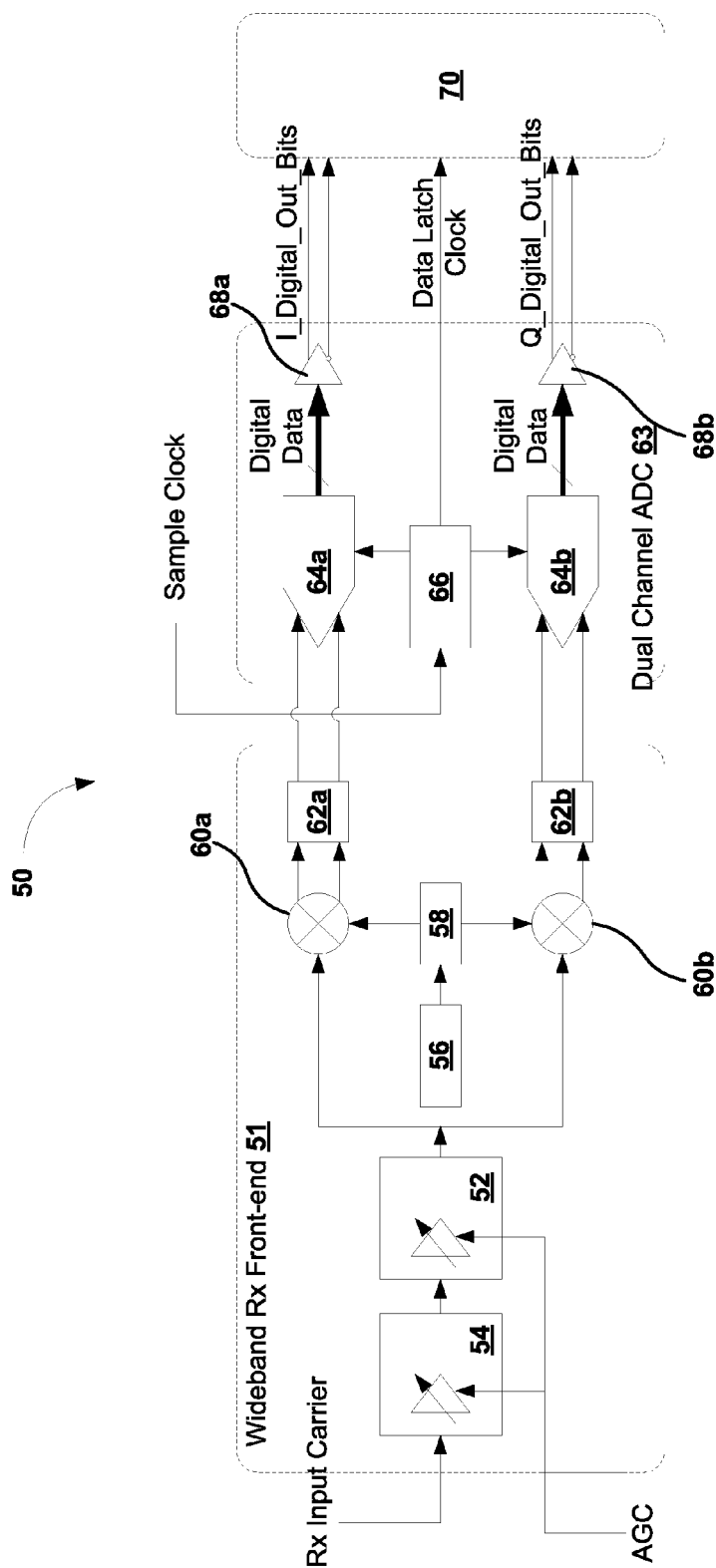
FIG. 4
(Conventional)

WIDEBAND AND NARROWBAND RECEIVER

TECHNICAL FIELD

The present disclosure relates generally to communications networks. More particularly, some embodiments of the present disclosure are directed toward systems and methods supporting wideband satellite communications without compromising narrowband performance at low cost.

BACKGROUND

Modern satellite communication systems provide a pervasive and reliable infrastructure to distribute voice, data, and video signals for global exchange and broadcast of information. These satellite communication systems have emerged as a viable option to terrestrial communication systems. Users in a shared access broadband network may be spread over a large geographical area and they may access the shared bandwidth from an access point (e.g., terminal) to an aggregation point, such as a network gateway. An operator on that shared access broadband network may provide, for example, internet services to one or more groups of users that subscribe to bandwidth from the operator. Such a group of terminals may, for example, be an enterprise with terminals in multiple geographical locations, or a virtual network operator (VNO) that provides internet services to users in a large geographic area.

Consider, for example, a digital video broadcast satellite network such as a DVBS-2 based geosynchronous earth orbit satellite network. DVB-S2 is a digital television broadcast standard developed by the DVB project (an industry consortium), and ratified by the European Telecommunications Standards Institute (ETSI) envisioned for broadcasting services, interactive services including Internet access, and data content distribution. Signals transmitted on the forward channel may be based on the DVB-S2 standard, while signals transmitted on the return channel may be based on the Internet Protocol over Satellite (IPoS) standard. In such a network, the IP layer and link gateway may be referred to as the IP gateway (IPGW) and the satellite gateway (SGW), respectively. The data stream may be broadcast to remote network nodes such as Very Small Aperture Terminals (VSATs). In the return direction on a satellite network, multiple VSATs may share one inroute with a certain amount of bandwidth when transmitting data. A bandwidth allocation module can manage and allocate bandwidth on the return channel.

The portion of the electromagnetic spectrum occupied by a particular transmission or communication system (i.e., bandwidth) may be wide or narrow. Wideband signals can be used to transmit large amounts of data in a relatively short period of time. For example, large computer data files and real-time video could benefit from a wideband signal. Narrowband signals can be used to conserve the electromagnetic spectrum when transmitting signals with more modest requirements. For example, base stations and cellular subscriber units in most conventional cellular communication systems transmit and receive voice signals using a relatively narrowband signal.

The amount of usable electromagnetic spectrum is limited by technology, environment, and cost. Extremely high frequency signals require expensive transceiving equipment. Accordingly, communication systems benefit by sharing desirable frequencies. Well known multiple access techniques, such as code division multiple access (CDMA), time division multiple access (TDMA), and frequency division multiple access (FDMA) can be used by a communication system to share the electromagnetic spectrum available to that system. However, these techniques require the signals to be of substantially the same bandwidth. For example, a cellular base station may transmit to a plurality of cellular subscriber units by dividing a portion of the spectrum (e.g., 869 MHz-894 MHz) into a plurality of relatively narrowband channels (e.g., 30 kHz). Similarly, a satellite communication system may transmit to a plurality of ground stations by dividing a portion of the spectrum (e.g., 3700 MHz-4200 MHz) into a plurality of relatively wideband channels (e.g., 36 MHz). The narrow-band signals and wideband signals occupy distinct portions of the electromagnetic spectrum in order to avoid interfering with each other.

SUMMARY

Systems and methods are provided in various embodiments for handling both wideband and narrowband carrier signal processing without compromising narrowband performance, and at low cost.

In accordance with one embodiment of the technology disclosed herein, an apparatus comprises a tuner comprising first and second narrowband filters for operating on a narrowband carrier signal. The apparatus further comprises first and second wideband filters for operating on a wideband carrier signal. Further still, the apparatus comprises an analog to digital converter (ADC) including first and second digital gain modules for adding digital gain to the wideband carrier signal.

In accordance with another embodiment of the technology disclosed herein, a method comprises receiving an input carrier signal, and applying a first gain to the input carrier signal. The method further comprises down-converting the input carrier signal, and filtering the down-converted input carrier signal utilizing one of a narrowband filter when the input carrier signal has a low symbol rate and a wideband filter when the input carrier signal has a high symbol rate. Further still, the method comprises digitizing the input carrier signal, adding digital gain to the input carrier signal if the input carrier signal has a high symbol rate, and outputting the digitized input carrier signal.

In accordance with yet another embodiment of the technology disclosed herein, a satellite set-top box comprises a receiver tuner for: receiving an input carrier signal, the input carrier signal comprising one of a narrowband carrier signal or a wideband carrier signal; applying a first gain to the input carrier signal; separating the input carrier signal into an in-phase component and a quadrature-phase component; down-converting in-phase and quadrature-phase components; and filtering the down-converted in-phase and quadrature-phase components utilizing a narrowband filter when the input carrier signal is the narrowband carrier signal. The satellite set-top box further comprises a wideband filter for filtering the input carrier signal when the input carrier signal is the wideband carrier signal, and a dual channel analog to digital converter (ADC) for: digitizing the filtered and down-converted in-phase and quadrature-phase components; adding digital gain if the input carrier signal is the wideband carrier signal; and outputting the digitized input carrier signal.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 3 illustrates an example of a conventional narrowband set-top box receiver configuration.

FIG. 4 illustrates an example of a conventional wideband set-top box receiver configuration.

Figure 1:
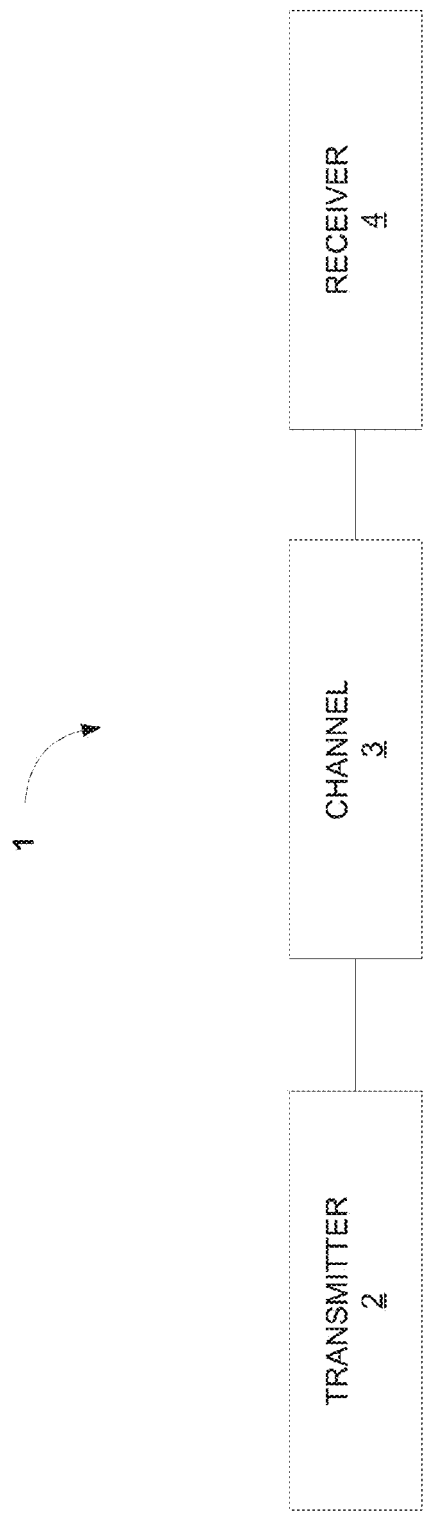
FIG. 1 illustrates a high-level representation of an example communication system in which various embodiments of the technology disclosed herein can be implemented.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

As noted above, VSAT systems allow commercial users to access one of a generally limited number of satellite return channels to support two-way communication. With the advent of high throughput satellite systems, the VSAT has to support high symbol rates. To be backward compatible with existing or legacy systems, lower symbol rates also require support.

Conventional systems and methods rely on, e.g., VSATs, that may be capable of supporting only a limited bandwidth spectrum, where manually swapping wideband and narrowband VSATs would be required in order to support the higher symbol rates associated with wideband carriers as well as the lower symbol rates associated with narrowband carriers.

As alluded to previously, to provide adequate flexibility and service, both high symbol rate and low symbol rate communications should be supported. A carrier on a satellite is made up of a sequence of joined together pulses to make a continuous signal. Each pulse is a symbol. According to the modulation method, each symbol represents 1, 2, 3, etc. bits of transmission rate data, and the symbol rate (also referred to as the modulation rate) can refer to the number of symbol changes made to the carrier per second using a digitally modulated signal or line code.

Typically, an analog-to-digital converter (ADC) (implemented as part of a receiver backend) is used that can handle wide carriers and narrow carriers. However, there is a tradeoff. For narrowband/narrow carrier communications, the carrier of interest at the input of the ADC signal is generally backed off from full scale due to multi narrowband carriers being present and to avoid interacting with the noise floor of the ADC that presents issues associated with spurious-free dynamic range (SFDR). Spurious-free dynamic range can refer to the strength ratio of a fundamental signal to the strongest spurious signal in the output (and can be used as a measure to specify ADC and digital-to-analog converters (DACS), as well as radio receiver, functionality). A spurious or spur can refer to a noise or harmonic distortion component, and in the context of an ADC/DAC output, SFDR can be defined as the ratio of the root-mean square (RMS) value of the carrier frequency at the ADC/DAC input or output, respectively, to the RMS value of the next largest spur at its output.

An ADC generally operates more optimally with a signal that is close to the ADC's full scale range so it can leverage the full dynamic range of the ADC. However, with a wide symbol carrier, a lot of power is coming into the ADC, and the situation arises where a narrow carrier signal arrives with or close to that of the wide carrier. Thus, the narrow carrier will appear to have much less power than that of the wide carrier. As a result, the narrow carrier will receive much less of the dynamic range than actually needed because of spurs on the ADC, creating a noise floor (with spurious on top of it). Thus, narrowband communications are often compromised when considered with wideband communications.

For example, satellite system used in high throughput satellites may require a receiver to work with high symbol rates, typically as high as 225 MSPS, although it should be noted that high symbol rate carriers are generally characterized as having greater than 45 MSPS symbol rates. In order to support these types of symbol rates, receiver tuner chips need to be able to operate with wide bandwidths. However, such wide bandwidth chips must also support lower symbol rates for operating in existing or legacy systems where symbol rates reach 1 MSPS or lower. For these types of receivers, conventional approaches involve sampling the wideband signal and receiving the narrowband signal through the same receive chain. This receiver design has limitations due to the typical low-cost ADC's which operate, e.g., in the 50 dB signal to noise ratio (SNR) range. With a full scale backoff of 12 dB on the ADC to accommodate higher order modulations, a 1 MSPS signal will be appearing at the ADC at −36 dB below full scale, and can only achieve a maximum SNR of 14 dB. For existing DVB-S2 satellite systems, a receiver which achieves 26 dB minimum SNR would be needed to avoid any performance impact (i.e., compromising of the narrowband signal).

Accordingly, various embodiments of the technology disclosed herein are directed to a receiver design that is capable of supporting wideband requirements without compromising narrowband performance. Moreover, such a receiver design can be very low cost, and eschewing the need for any expensive and/or specialized elements.

In particular, an ADC with a higher resolution (e.g., 12 bit) core can be utilized and mapped to a lower resolution (e.g. 8 bits). The higher resolution ADC core allows an implementation of (adjustable) internal digital gain control without compromising the receiver SNR, depending on the final ADC output resolution. Such an ADC can be implemented at relatively low cost. Further still, low cost tuner elements can be used in conjunction with the low cost ADC, where the internal and adjustable digital ADC gain can be adjusted based on the input signal level (i.e., whether the signal is wideband or narrowband that is related to the carrier symbol level) to prevent the need for compromising narrowband performed due to the aforementioned spurious issue. In accordance with one embodiment, the 12 bit ADC can be mapped down to an 8 bit interface (commensurate with common satellite system application-specific integrated circuit (ASIC) specifications or requirements). However, ADCs, tuners, and other elements described herein can be adapted to meet other specifications or requirements. For example, the ADC can retain a 12 bit interface on the backend rather than being mapped to an 8 bit interface. Additionally, various embodiments can be configured to handle symbol rates as low as, e.g., 256 KSPS, where there are no tuner limitations.

FIG. 1 illustrates a block diagram of a communications system 1 capable of employing a receiver design in accordance with various embodiments. With reference to FIG. 1, a broadband communications system 1 includes one or more transmitters 2 (of which one is shown) that generate signal waveforms across a communications channel 3 to one or more receivers 4 (of which one is shown). In this discrete communications system 1, the transmitter 2 has a signal source that produces a discrete set of data signals, where each of the data signals has a corresponding signal waveform. These signal waveforms are attenuated, or otherwise altered, by communications channel 3. Coding may be utilized to combat noise and other issues associated with the channel 3, such as forward error correction (FEC) codes.

Figure 2:
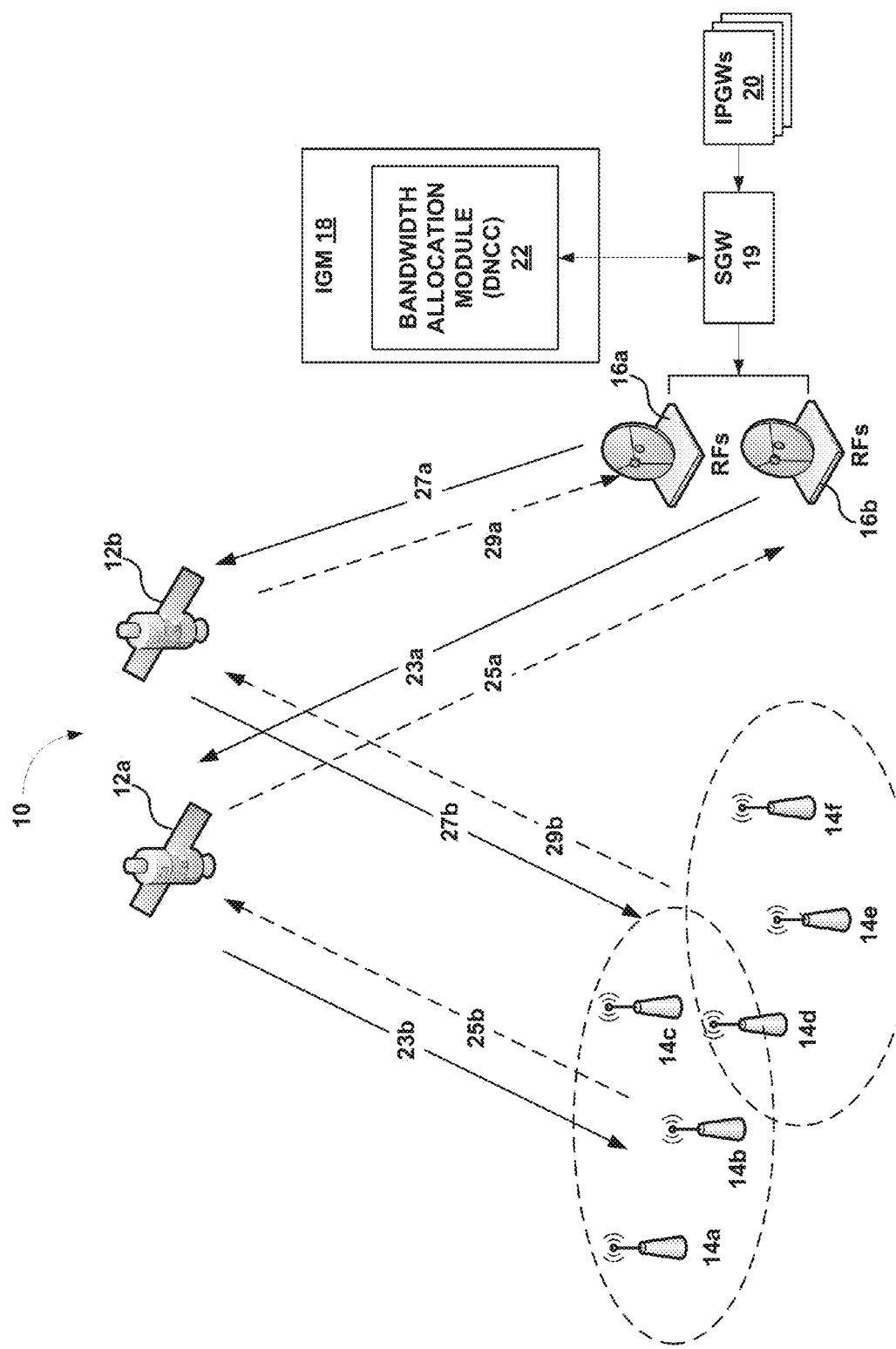
FIG. 2 illustrates an example multi-satellite data transmission system in which various embodiments of the technology disclosed herein can be implemented.

FIG. 2 illustrates an example satellite network 10 in which various embodiments of the technology disclosed herein may be implemented. The spectrum of one satellite beam can be segmented into a plurality of inroutes. For example, the frequency spectrum of a satellite beam can be split into a number of inroutes with symbol rates of, for example, 512 KSPS, 1 MSPS, 2 MSPS, 4 MSPS, etc. Inroutes within a certain geographical area that share these spectrum resources can be handled hierarchically. A grouping of inroutes that are at the same symbol rate and handled as a common pool can be referred to as an inroute group (IG). IGs of multiple symbol rates can also be handled as a common pool or set. The entire shared spectrum of a given satellite spot beam may be split into several such common sets. An IGM can manage bandwidth for a common set of multiple IGs. Depending on the digital modulation scheme that is utilized (e.g., quadrature phase shift keying (QPSK)), the number of symbols used to communicate can vary, and as such, the symbol rate can also vary.

Satellite network 100 in this example can include multiple satellites 12a and 12b, remote terminals 14a-14f, radio frequency (RF) terminals 16a and 16b, SGW 19, IPGWs 20, and a dynamic network control cluster (DNCC) or bandwidth allocation module 22 that may be implemented as or within an IGM 18. The satellite network may be a shared access broadband network. Other types of shared access networks may include, for example, wireless networks such as 4$^{th}$ Generation Long Term Evolution (4G LTE) and WiMAX networks, which may include terminals other than VSATs, such as cellular and WiFi equipped devices.

Feeder links may carry data between RF terminals 16a and 16b and satellites 12a and 12b, and may include: forward uplinks 23a and 27a for transmitting data from RF terminals 16a and 16b to satellites 12a and 12b, respectively; and return downlinks 25a and 29a for transmitting data from satellites 12a and 12b, respectively, to RF terminals 16a and 16b. User links may carry data between satellites 12a and 12b and remote terminals 14a-14f, and may include: return uplinks 25b and 29b for transmitting data from remote terminals 14a-14f to satellites 12a and 12b, respectively; and forward downlinks 23b and 27b for transmitting data from satellites 12a and 12b, respectively, to remote terminals 14a-14f. Forward uplinks 23a, 27a and forward downlinks 23b, 27b may form an outroute, and return uplinks 25b, 29b and return downlinks 25a, 29a may form an inroute. SGW 19 may include high capacity earth stations with connectivity to ground telecommunications infrastructure. SGW 19 may be communicatively connected to RF terminals 16a and 16b. RF terminals 16a and 16b may be the physical equipment responsible for sending and receiving signals to and from satellites 12a and 12b, respectively, and may provide air interfaces for SGW 19/IPGWs 20.

Satellites 12a and 12b may be any suitable communications satellites. For example, satellites 12a and 12b may be bent-pipe design geostationary satellites, which can accommodate innovations and variations in transmission parameters, operating in the Ka-band. Satellites 12a and 12b may use spot beams as well as frequency and polarization reuse to maximize the total capacity of satellite network 10. Signals passing through satellites 12a and/or 12b in the forward direction may be based on the DVB-S2 standard (ETSI EN 302 307) using signal constellations up to and including at least 32-APSK. The signals intended to pass through satellites 12a and 12b in the return direction (toward terminals 14a-14f) may be based on the Internet Protocol over Satellite (IPoS) standard (ETSI TS 102 354). Other suitable signal types may also be used in either direction, including, for example higher data rate variations of DVB-S2.

IPGWs 20 may be an ingress portion of a local network. IP traffic, including TCP traffic, from the internet may enter an SGW 19 through IPGWs 20. IPGWs 20 may each include a spoofer, which may acknowledge IP traffic, including TCP traffic sent to SGW 19. Moreover, SGW 19 may be connected to an internet through IPGWs 20. IP traffic, including TCP traffic, from the internet may enter SGW 19 through IPGWs 20. As illustrated in FIG. 1, multiple IPGWs may be connected to IGM 18. The bandwidth of RF terminals 16a and 16b can be shared amongst IPGWs 20. At each of IPGWs 20, real-time (RT) and NRT traffic flows may be classified into different priorities. These traffic flows may be processed and multiplexed before being forwarded to priority queues at SGW 19. RT traffic may go directly to an RT priority queue or SGW 19, while NRT traffic flows may be serviced based on the respective priority and volume. Data may be further packed into DVB-S2 code blocks and stored in a code block buffer before transmission.

Data from the internet intended for remote terminals 14a-14f (e.g., VSATs) may be in the form of IP packets, including TCP packets and UDP packets, or any other suitable IP packets, and may enter SGW 19 at any one of IPGWs 20, where the respective spoofer may send an acknowledgment back to the sender of the IP packets. The IP packets may be processed and multiplexed by SGW 19 along with IP packets from other IPGWs, where the IPGWs may or may not have the same service capabilities and relative priorities. The IP packets may then be transmitted to satellites 12a and 12b on forward uplinks 23a and 27a using the air interfaces provided by RF terminals 16a and 16b. Satellites 12a and 12b may then transmit the IP packets to the VSATs using forward downlinks 23b and 27b. Similarly, IP packets may enter the network via the VSATs, be processed by the VSATs, and transmitted to satellites 12a and 12b on return uplinks 25b and 29b. Satellites 12a and 12b may then send these inroute IP packets to the SGW 19/IP-GWs 20 using return downlinks 25a and 29a.

Each of remote terminals 14a-14f can be, for example, VSATs and may connect to the Internet through satellites 12a and 12b and IPGWs 20/SGW 19. For example, remote terminal 14a may be used at a residence or place of business to provide a user with access to the Internet, such as a modem. VSATs or Mobile Satellite Terminals (MSTs), may be used by end users to access the satellite network, and may include a remote satellite dish for receiving RF signals from and transmitting RF signals to satellite 12a, as well as a satellite modem and other equipment for managing the sending and receiving of data. They may also include one or more remote hosts, which may be computer systems or other electronic devices capable of network communications at a site.

One or more IGMs can be implemented, one of which is illustrated as IGM 18. An IGM may be a bandwidth controller running bandwidth allocation algorithms. The IGM may assign bandwidth to the remote terminals 14a-14f in the form of inroute and IGs, based in part on bandwidth demand requests from the remote terminals 14a-14f.

As alluded to above, conventional technologies rely on a wideband receiver to support all the symbol rates needed to support wideband and narrowband communications, e.g., from carriers with a 1 MSPS symbol rate to carriers with a 225 MSPS symbol rate. The SFDR of conventional receivers limit the performance of the narrow bandwidth carriers. Other receivers can include multiple paths for the narrowband and wideband signals, but are costly and unsuitable for low cost VSAT terminal applications. Also, the power consumption of conventional receivers is relatively large in comparison to receivers configured in accordance with various embodiments as will be discussed in greater detail below.

A typical satellite set-top box receiver can support either narrowband or wideband carriers, but not both, requiring the swapping out of receivers if, e.g., a user's network capacity grows and expands over time. FIG. 3 and FIG. 4 below depict example, conventional narrowband and wideband set-top box receiver systems and the respective carrier signal flows for each case.

FIG. 3 illustrates a conventional set-top box receiver 30 that supports narrowband carriers. Set-top box receiver 30 may include a narrowband receiver front-end portion 31, a dual channel ADC 41, and a demodulation processor/processing block 48. As illustrated in FIG. 3, an input carrier is received at front-end 31, and automatic gain control (AGC) control via an external signal can be applied using a radio frequency (RF) variable gain amplifier (VGA) 32 allowing the input carrier amplitude to be controlled/leveled that enables set-top box receiver 30 to operate over a greater input power dynamic range (although still not optimally from narrowband to wideband). The signal may then be passed to matched mixers 38 and 38b for down-conversion.

Matched mixers 38a and 38b, a fractional-N phase locked loop (PLL)_element 34, along with 0/90° phase splitter selector 36 operate to perform a zero-IF down-conversion of the input carrier signal down to baseband, where the intermediate frequency (IF) is zero and the image to the desired channel is the channel itself. As a result, the in-phase and quadrature-phase components are output to narrowband variable filters 40a and 40b, which may then be passed to a dual channel ADC 41. Dual channel ADC 41 may include 8 bit core ADCs 42a and 42b, and a clock distribution block 44 at which a sampling clock can be received. After conversion, the digital data can be forwarded as I and Q digital output bits to demodulation processor 48 via high speed buffers 46a and 46b.

FIG. 4 illustrates a conventional set-top box receiver 50 that supports wideband carriers. Set-top box receiver 50 may include a wideband receiver front-end portion 51, a dual channel ADC 63, and a demodulation processor/processing block 70. As illustrated in FIG. 4, an input carrier is received at front-end 51, and AGC control via an external signal can be applied using an RF VGA 52 allowing the signal amplitude of the input carrier to be controlled/leveled allowing set-top box receiver 50 to operate over a greater input range (although still not optimally from narrowband to wideband). Unlike the narrowband receiver front-end portion 31 of FIG. 3, an additional RF gain block 54 is utilized to fully support the high dynamic input carrier power ranges associated with wideband carriers. Adjacent narrow-band carriers would not be suppressed due to the use of fixed wide-band filters 62a and 62b (described below) and hence, the dynamic range (i.e. throughput performance) at the demodulation processing block 70 would be reduced. The signal may then be passed matched mixers 60a and 60b for down-conversion.

Matched mixers 60a and 60b, a fractional-N phase locked loop (PLL) element 56, along with 0/90° phase splitterselector 58 operate to perform a zero-IF down-conversion of the input carrier signal down to baseband, again where the intermediate frequency (IF) is zero and the image to the desired channel is the channel itself. As a result, the in-phase and quadrature-phase components are output to fixed wideband filters 62a and 62b, which may then be passed to a dual channel ADC 63. Dual channel ADC 63 may include 8 bit core ADCs 64a and 64b, and a clock distribution block 66 at which a sampling clock can be received. After conversion, the digital data can be forwarded as I and Q digital output bits to demodulation processor 48 via high speed buffers 68a and 68b.

As described above, a receiver system design in accordance with various embodiments can employ a low cost broadcast tuner chip (narrowband and wideband receiver front-end portion) and a low cost ADC working in conjunction such that together, they allow for high symbol rate support without compromising performance with low symbol rate carriers. The tuner may have a "bypassable" internal narrowband filter. Moreover, the tuner can be configured to operate with an external wideband filter that can be used to support higher symbol rates. The tuner along with the ADC, which may be a higher resolution ADC (e.g., 12 bit ADC) that has internal gain control and that can be mapped to keep the digital interface at 8 bits, can form a low cost VSAT receiver in accordance with various embodiments. The broadcast tuner can have high gain in narrowband mode (allowing for more of or for full dynamic range utilization) which can be dropped while in wideband mode. In order to compensate for the gain loss, the internal ADC gain is set higher for wideband mode, e.g., to 16 times the input signal, while still mapping to an 8-bit output. Again, such ADCs can be implemented at low cost. By combining a low cost broadcast tuner with a low cost ADC, the receiver design achieves very low cost while still meeting the performance requirements associated with both wideband and narrowband communications without any compromises.

Figure 5:
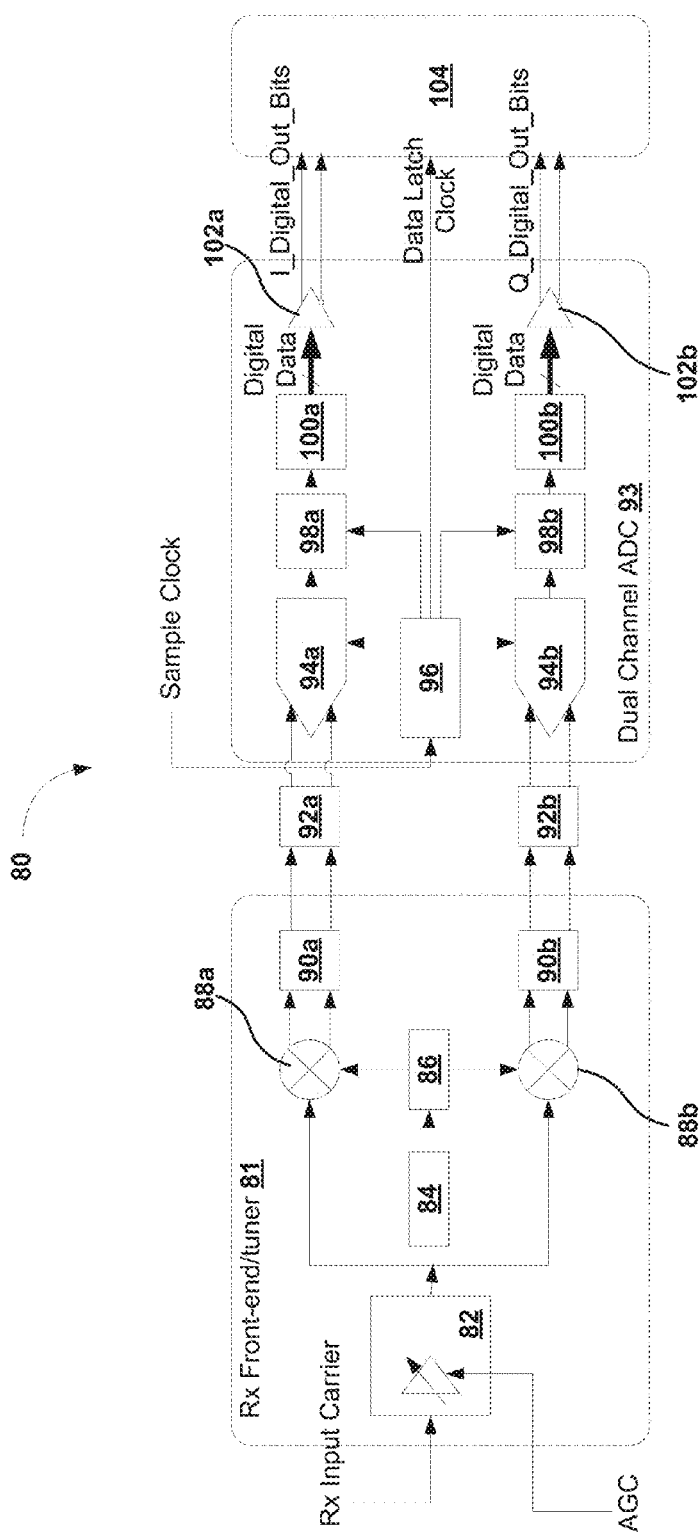
FIG. 5 illustrates an example of a fully integrated satellite set-top box receiver system in accordance with various embodiments of the technology disclosed herein.

FIG. 5 illustrates an example of carrier flow for a set-top box receiver 80 that supports wideband carriers upwards of, e.g., 225 MSPS (and beyond) as well as narrowband carriers down to, e.g., 1 MPSPS (or lower). Set-top box receiver 80 can include a fully integrated front-end receiver/tuner 81, an integrated ADC 93 with digital gain, and a demodulation processing block 104.

Tuner 81 may receive an input carrier and AGC control via an external signal can be applied using an RF VGA 82 allowing the signal amplitude of the input carrier to be controlled/leveled so that set-top box receiver 80 can operate over a greater input range. The input carrier signal may be received from an outdoor unit which in turn has been received from a satellite. The signal may then be passed to matched mixers 88a and 88b for down-conversion.

Matched mixers 88a and 88b, fractional-N phase locked loop (PLL) element 84, along with 0/90° phase splitter selector 86 operate to perform a zero-IF down-conversion of the input carrier signal down to baseband, again where the IF is zero and the image to the desired channel is the channel itself. As a result, the in-phase and quadrature-phase components are output to bypassable narrowband variable filters 90a and 90b. For carriers with high symbol rates, e.g., greater than 45 MSPS narrowband variable filters, 90a and 90b can be bypassed. It should be noted that the threshold for rising above what may be considered to be narrowband/low symbol rate carriers can be adjusted in accordance with desired operating parameters. Thus variable filters 90a and 90b can be utilized for narrowband carriers, and bypassed to fixed wideband filters 92a and 92b for wideband/high symbol rate carrier operations. The variable low-pass filters 90a and 90b enable low symbol rate operations by filtering out-of-band noise and spurious, hence, improving the dynamic range of the set-top box receiver 80. For wideband operation, lower gain is available via RF VGA 82. The down-converted signals from tuner 81 may then be passed to dual channel ADC 93 to be digitized.

Dual channel ADC 93 may include 12 bit core ADCs 94a and 94b, and a clock distribution block 96 at which a sampling clock can be received. The 12 bit cores 94a and 94b for each ADC channel can be mapped to 8 bit digital data at 100a and 100b prior to interfacing with demodulation processor 104. Due to the higher resolution ADC core, a digital gain of up to 24× can be configured via 98a and 98b without degrading an in-coming input signal's signal to noise ratio (SNR). It should be noted that dual channel ADC 93 may support higher digital gain, e.g., up to a 50× gain, although SNR may have to be addressed.

The internal digital gain added at 98a and 98b can be used for wideband operations due to the lack of sufficient RF VGA gain of tuner 81 in wideband mode. The use of digital gain in dual channel ADC 93 can eliminate the need for an extra RF amplifier (i.e., low noise amplifier (LNA)) stage. This also aids in reducing the overall receiver design cost and allows for a smaller form-factor printed-wiring board (PWB). After conversion and mapping, the digital data can be forwarded as I and Q digital output bits to demodulation processor 104 via high speed buffers 102a and 102b.

Thus, a 12 bit ADC can be utilized and digital gain can be subsequently adjusted to adapt to different signal levels based on a symbol rate of the carrier. That is, for carriers with a high symbol rate, digital gain can be increased in the ADC. In this way, wideband performance need not be compromised, and a lower input level into the ADC can be allowed because of the use of internal gain (added afterwards) in the ADC. Furthermore, the cost of the RF chain can be kept lower because the corresponding tuner can use reduced RF gain.

It should be noted that application of the digital gain is fully programmable. Symbol rates that range from, e.g., 1 MSPS to 225 MSPS, can be handled with a single tuner and receiver combination in accordance with various embodiments, resulting in the ability to handle carriers that vary several orders of magnitude.

As discussed previously, legacy receiver designs may require a high RF amplification gain range for wideband operations because a conventional ADC does not have digital gain. Thus, a conventional receiver may only be capable of handling, e.g., 1 MSPS to 45 MSPS operations, and the cost of implementing a conventional ADC is relatively higher than an ADC having digital gain as disclosed herein because the amplification state must be in the RF frequency band. Additionally, a legacy receiver does not integrate variable low-pass filtering for low symbol rate operations. Therefore and again, dynamic performance (energy per symbol to noise power spectral density (Es/No) or SNR) is negatively impacted.

Considering legacy narrowband (e.g., 25 MSPS) and wideband (e.g., 225 MSPS) VSAT terminals, Es/No performance can be compared to that of a low cost set-top box receiver configured in accordance with various embodiments. A carrier of 14.5 dB Es/No at RF frequency can be injected into the receiver, where the demodulation processor estimates the carrier Es/No, and the results are illustrated in Tables 1 and 2 which reflect Es/No performance with a 225 MSPS carrier and a 25 MSPS carrier, respectively.

TABLE 1

| 225 Msps Carrier | | New Receiver vs Legacy Receiver | |
| --- | --- | --- | --- |
| IDU Input Power (dBm) | SymRate | ADC Gain | Demod Es/No Measured Delta (dB) |
| −13.7 | 225 Msps | 16X | 0.01 |
| −18.7 | 225 Msps | 16X | 0.1 |
| −28.7 | 225 Msps | 16X | 0.08 |
| −38.7 | 225 Msps | 16X | ∼0.0 |
| −48.7 | 225 Msps | 16X | ∼0.0 |
| −58.7 | 225 Msps | 16X | 0.39 |
| −63.7 | 225 Msps | 16X | 0.53 |
| −66.7 | 225 Msps | 16X | 0.65 |

The performance comparison illustrated in Table 1 indicates that a fully integrated set-top box receiver, e.g., receiver 80 of FIG. 5 with 16× of ADC digital gain is comparable to a legacy wideband receiver, e.g., receiver 50 of FIG. 4, at the full input power range of −14 dBm to −67 dBm. At the lower input power, the performance of a fully integrated set-top box receiver configured in accordance with various embodiments exceeds that of a the legacy receiver, where the internal ADC gain does not degrade S/N performance at 16× of ADC digital gain.

TABLE 2

| 25 Msps Carrier | | New Receiver vs Legacy Receiver | |
| --- | --- | --- | --- |
| IDU Input Power (dBm) | SymRate | ADC Gain | Demod Es/No Measured Delta (dB) |
| −13.7 | 25 Msps | 5X | 0.08 |
| −18.7 | 25 Msps | 5X | 0.1 |
| −28.7 | 25 Msps | 5X | 0.08 |
| −38.7 | 25 Msps | 5X | ∼0.0 |
| −48.7 | 25 Msps | 5X | ∼0.0 |
| −58.7 | 25 Msps | 5X | 0.09 |
| −63.7 | 25 Msps | 5X | −0.1 |
| −66.7 | 25 Msps | 5X | 1.1 |
| −68.7 | 25 Msps | 5X | 0.82 |

The performance comparison illustrated in Table 2 indicates that a fully integrated set-top box receiver, e.g., receiver 80 of FIG. 5 with 5×ADC digital gain (5× of gain only utilized in narrowband operation) is comparable to a legacy receiver at the full input power range of −14 dBm to −68 dBm. At the lower input power, a fully integrated set-top box receiver configured in accordance with various embodiments outperforms a legacy receiver. Again, a fully integrated set-top box receiver's ADC internal gain in accordance with various embodiments does not degrade S/N performance at 5χ. Additionally, the tuner's integrated low-pass filter can improve the dynamic range.

It should be noted that various embodiments of the technology disclosed herein can be adapted for use in any system when a wide range of operability is desired. Moreover, although various embodiments have been described in the context of a set-top box receiver (indoor unit), a fully integrated receiver configured in accordance with various embodiments can be implemented at any radio receiver or somewhere in the receive chain.

Various embodiments support both wideband and narrowband, e.g., DVB-S2 waveforms without compromising performance, and the use of costly RF gain stages, PWB area, and power consumption can be minimized. The use of base-band differential drivers with variable gains, which are both costly and notorious for high power consumption for wide bandwidth applications, can be eliminated. At low input power, a Rx carrier can be amplified at baseband without degradation to the ADC dynamic range, and digital gain blocks can be integrated within the ADC and can be dynamically configured while maintaining low power consumption. Further still, one receiver can be used for operations in both US and international satellite broadband markets, and provides users the ability to grow a network from narrowband to wideband, e.g., as its business grows without changing terminals/hardware equipment.

Figure 6:
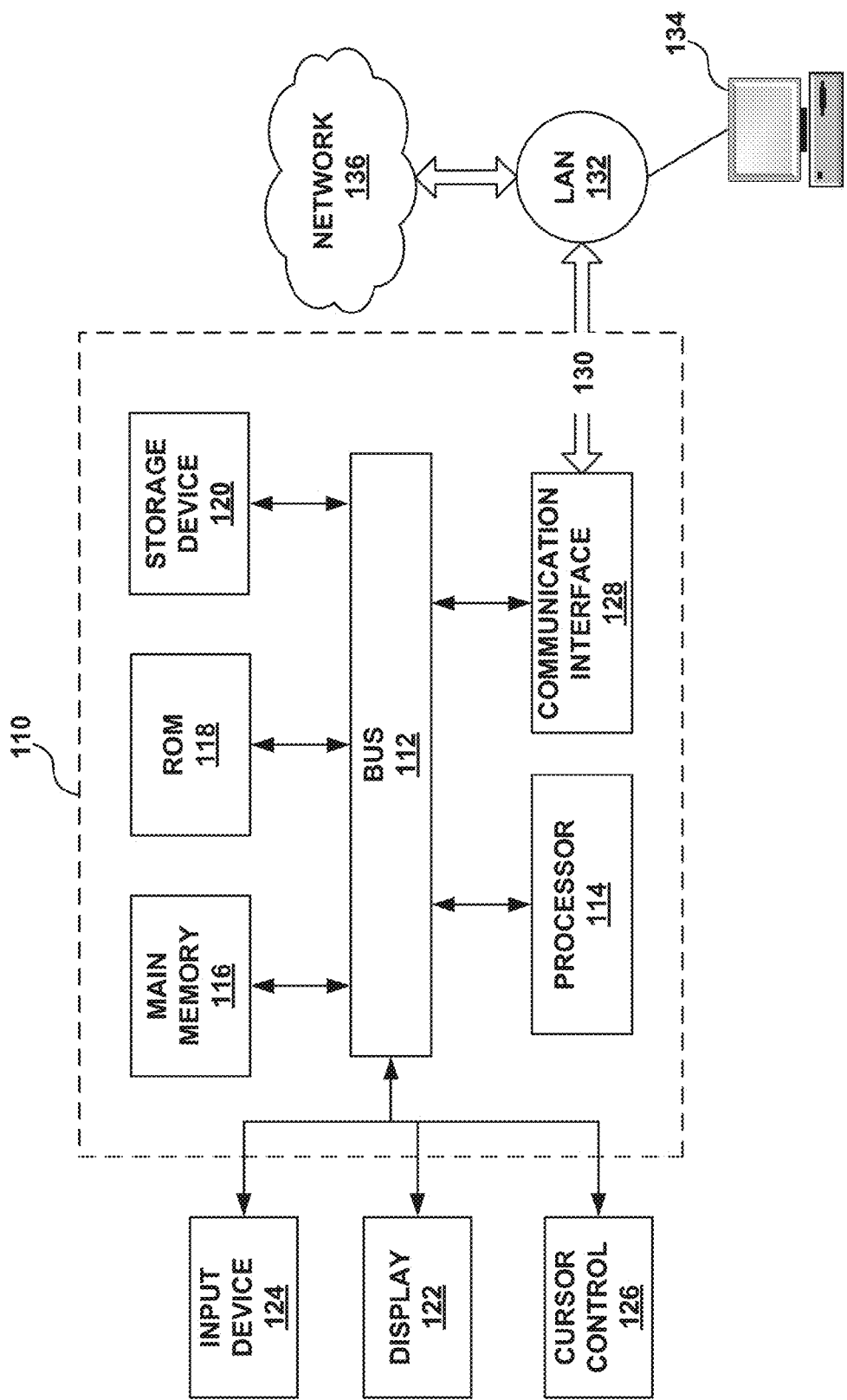
FIG. 6 illustrates an example computing module that may be used in implementing features of various embodiments of the technology disclosed herein.

FIG. 6 illustrates a computer system 110 upon which example embodiments according to the technology disclosed herein can be implemented. Computer system 110 can include a bus 112 or other communication mechanism for communicating information, and a processor 114 coupled to bus 112 for processing information. Computer system 110 may also include main memory 116, such as a random access memory (RAM) or other dynamic storage device, coupled to bus 112 for storing information and instructions to be executed by processor 114. Main memory 116 can also be used for storing temporary variables or other intermediate information during execution of instructions to be executed by processor 114. Computer system 110 may further include a read only memory (ROM) 118 or other static storage device coupled to bus 112 for storing static information and instructions for processor 114. A storage device 120, such as a magnetic disk or optical disk, may additionally be coupled to bus 112 for storing information and instructions.

Computer system 110 can be coupled via bus 112 to a display 122, such as a cathode ray tube (CRT), liquid crystal display (LCD), active matrix display, light emitting diode (LED)/organic LED (OLED) display, digital light processing (DLP) display, or plasma display, for displaying information to a computer user. An input device 124, such as a keyboard including alphanumeric and other keys, may be coupled to bus 112 for communicating information and command selections to processor 114. Another type of user input device is cursor control 126, such as a mouse, a trackball, or cursor direction keys for communicating direction information and command selections to processor 114 and for controlling cursor movement on display 122.

According to one embodiment, wideband and narrowband support can be provided by a receiver module or element, such as a set-top box receiver system, utilizing computer system 110 in response to processor 114 executing an arrangement of instructions contained in main memory 116. Such instructions can be read into main memory 116 from another computer-readable medium, such as storage device 120. Execution of the arrangement of instructions contained in main memory 116 causes processor 114 to perform one or more processes described herein. One or more processors in a multi-processing arrangement may also be employed to execute the instructions contained in main memory 116. In alternative embodiments, hard-wired circuitry is used in place of or in combination with software instructions to implement various embodiments. Thus, embodiments described in the present disclosure are not limited to any specific combination of hardware circuitry and software.

Computer system 110 may also include a communication interface 128 coupled to bus 112. Communication interface 128 can provide a two-way data communication coupling to a network link 130 connected to a local network 132. By way of example, communication interface 128 may be a digital subscriber line (DSL) card or modem, an integrated services digital network (ISDN) card, a cable modem, or a telephone modem to provide a data communication connection to a corresponding type of telephone line. As another example, communication interface 128 may be a local area network (LAN) card (e.g. for Ethernet™ or an Asynchronous Transfer Model (ATM) network) to provide a data communication connection to a compatible LAN. Wireless links can also be implemented. In any such implementation, communication interface 98 sends and receives electrical, electromagnetic, or optical signals that carry digital data streams representing various types of information. Further, communication interface 128 may include peripheral interface devices, such as a Universal Serial Bus (USB) interface, a PCMCIA (Personal Computer Memory Card International Association) interface, etc.

Network link 130 typically provides data communication through one or more networks to other data devices. By way of example, network link 130 can provide a connection through local network 132 to a host computer 134, which has connectivity to a network 136 (e.g. a wide area network (WAN) or the global packet data communication network now commonly referred to as the "Internet") or to data equipment operated by a service provider. Local network 132 and network 136 may both use electrical, electromagnetic, or optical signals to convey information and instructions. The signals through the various networks and the signals on network link 130 and through communication interface 128, which communicate digital data with computer system 110, are example forms of carrier waves bearing the information and instructions.

Computer system 110 may send messages and receive data, including program code, through the network(s), network link 130, and communication interface 128. In the Internet example, a server (not shown) might transmit requested code belonging to an application program for implementing an embodiment of the present invention through network 106, local network 132 and communication interface 128. Processor 114 executes the transmitted code while being received and/or store the code in storage device 120, or other non-volatile storage for later execution. In this manner, computer system 110 obtains application code in the form of a carrier wave.

The term "computer-readable medium" as used herein refers to any medium that participates in providing instructions to processor 114 for execution. Such a medium may take many forms, including but not limited to non-volatile media, volatile media, and transmission media. Non-volatile media include, for example, optical or magnetic disks, such as storage device 120. Volatile media may include dynamic memory, such as main memory 116. Transmission media may include coaxial cables, copper wire and fiber optics, including the wires that comprise bus 112. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. By way of example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on a storage device either before or after execution by the processor.

Figure 7:
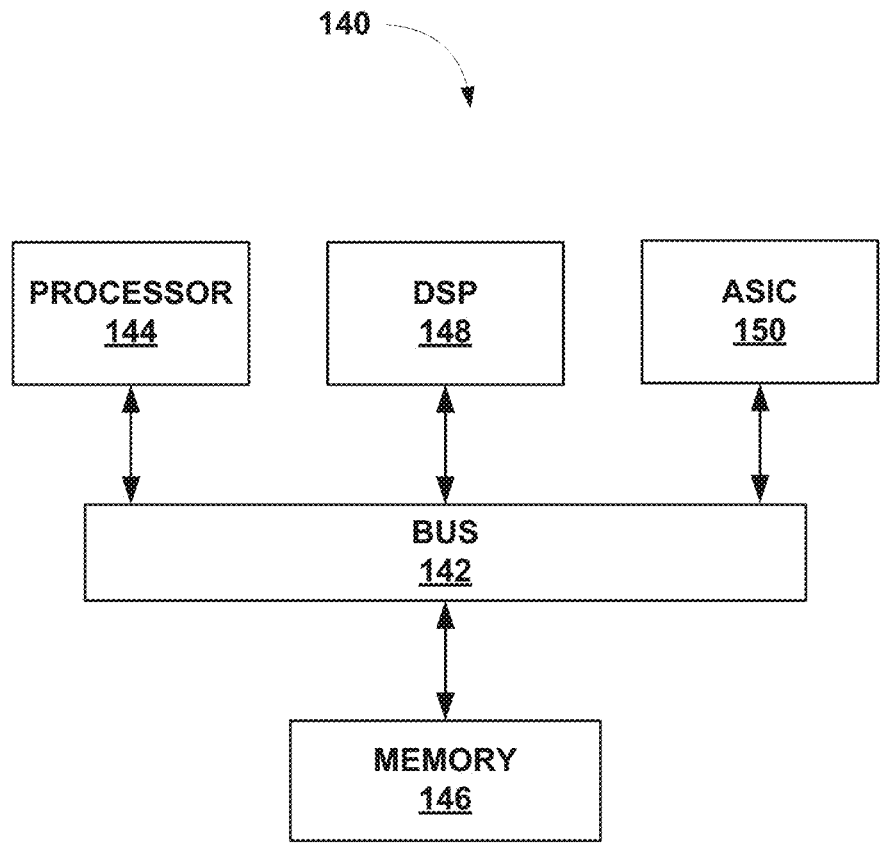
FIG. 7 illustrates an example chip set that can be utilized in implementing architectures and methods for dynamic bandwidth allocation in accordance with various embodiments of the technology disclosed herein.

FIG. 7 illustrates a chip set 140 in which embodiments of the technology disclosed herein may be implemented. Chip set 140 can include, for instance, processor and memory components described with respect to FIG. 6 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, chip set 140 includes a communication mechanism such as a bus 142 for passing information among the components of the chip set 140. A processor 144 has connectivity to bus 142 to execute instructions and process information stored in a memory 146. Processor 144 includes one or more processing cores with each core configured to perform independently. A multi-core processor enables multiprocessing within a single physical package. Examples of a multi-core processor include two, four, eight, or greater numbers of processing cores. Alternatively or in addition, processor 144 includes one or more microprocessors configured in tandem via bus 142 to enable independent execution of instructions, pipelining, and multithreading. Processor 144 may also be accompanied with one or more specialized components to perform certain processing functions and tasks such as one or more digital signal processors (DSP) 148, and/or one or more application-specific integrated circuits (ASIC) 150. DSP 148 can typically be configured to process real-world signals (e.g., sound) in real time independently of processor 144. Similarly, ASIC 150 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

Processor 144 and accompanying components have connectivity to the memory 146 via bus 142. Memory 146 includes both dynamic memory (e.g., RAM) and static memory (e.g., ROM) for storing executable instructions that, when executed by processor 144, DSP 148, and/or ASIC 150, perform the process of example embodiments as described herein. Memory 146 also stores the data associated with or generated by the execution of the process.

As used herein, the term module might describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the application are implemented in whole or in part using software, in one embodiment, these software elements can be implemented to operate with a computing or processing module capable of carrying out the functionality described with respect thereto. One such example computing module is shown in FIG. 6. Various embodiments are described in terms of this example-computing module 80. After reading this description, it will become apparent to a person skilled in the relevant art how to implement the application using other computing modules or architectures.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the present application, whether or not such embodiments are described and whether or not such features are presented as being a part of a described embodiment. Thus, the breadth and scope of the present application should not be limited by any of the above-described exemplary embodiments.

Terms and phrases used in the present application, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An apparatus, comprising:
   a tuner comprising first and second narrowband filters for operating on a narrowband carrier signal, wherein the first and second narrowband filters are bypassable narrowband filters;
   first and second wideband filters, separate from the first and second narrowband filters and connected in series with a respective one of the first and second narrowband filters, the first and second wideband filters for operating on a wideband carrier signal when the first and second narrowband filters are bypassed, wherein each of the first and second narrowband filters is bypassed when a signal passes through but is not filtered by the narrowband filter; and
   an analog to digital converter (ADC) including first and second digital gain modules for adding digital gain to the wideband carrier signal.

2. The apparatus of claim 1, wherein the tuner further comprises a variable gain amplifier for applying gain to a receiver input carrier signal, the receiver input carrier signal comprising one of the narrowband carrier signal or the wideband carrier signal.

3. The apparatus of claim 2, wherein the tuner further comprises a zero-IF down-conversion portion for converting the receiver input carrier signal to baseband.

4. The apparatus of claim 1, wherein the narrowband carrier signal has a symbol rate of less than 45 MSPS.

5. The apparatus of claim 1, wherein the wideband carrier signal has a symbol rate of greater than or equal to 45 MSPS.

6. The apparatus of claim 1, wherein the first and second wideband filters are fixed wideband filters.

7. The apparatus of claim 1, wherein the first and second wideband filters are implemented external to the tuner.

8. The apparatus of claim 1, wherein the first and second narrowband filters comprise variable bandwidth low-pass filters, and wherein one of the first and second narrowband filters filters an in-phase component of the narrowband carrier signal and another one of the first and second narrowband filters filters a quadrature-phase component of the narrowband carrier signal.

9. The apparatus of claim 1, wherein the ADC comprises a dual channel ADC for receiving filtered and down-converted in-phase and quadrature-phase components of one of the narrowband and wideband carrier signal.

10. The apparatus of claim 9, wherein the ADC further comprises first and second digital gain modules for adding the digital gain to the in-phase and quadrature-phase components of the wideband carrier signal.

11. The apparatus of claim 10, wherein the ADC further comprises first and second 12-bit cores for digitizing the in-phase and quadrature-phase components of one of the narrowband and wideband carrier signal.

12. The apparatus of claim 11, wherein the ADC further comprises first and second 8-bit mapping modules for mapping the in-phase and quadrature-phase components of one of the narrowband and wideband carrier signal from 12 bits to 8 bits in accordance with an 8-bit interface to a demodulation processor.

13. A method, comprising:
    receiving an input carrier signal;
    applying a first gain to the input carrier signal;
    down-converting the input carrier signal;
    filtering the down-converted input carrier signal utilizing one of a bypassable narrowband filter when the input carrier signal has a low symbol rate and a wideband filter, separate from the narrowband filter and connected in series with the bypassable narrowband filter, when the input carrier signal has a high symbol rate and the bypassable narrowband filter is bypassed, wherein the bypassable narrowband filter is bypassed when a signal passes through but is not filtered by the bypassable narrowband filter;
    digitizing the input carrier signal;
    adding digital gain to the input carrier signal if the input carrier signal has a high symbol rate; and
    outputting the digitized input carrier signal.

14. The method of claim 13, further comprising mapping the input carrier signal from 12-bit digital data to 8-bit digital data.

15. The method of claim 14, wherein the mapping is performed at an analog to digital converter (ADC) comprising an 8-bit mapping module.

16. The method of claim 13, wherein the receiving of the input carrier signal, the application of the first gain, the down-conversion, and the filtering utilizing the narrowband filter is performed at a receiver tuner chip.

17. The method of claim 16, wherein the filtering utilizing the wideband filter is performed at an external filter.

18. The method of claim 15, wherein the digitizing and the addition of digital gain is performed at the ADC.

19. A satellite set-top box, comprising:
    a receiver tuner for:
    receiving an input carrier signal, the input carrier signal comprising one of a narrowband carrier signal or a wideband carrier signal;
    applying a first gain to the input carrier signal;

separating the input carrier signal into an in-phase component and a quadrature-phase component;

down-converting the in-phase and quadrature-phase components; and filtering the down-converted in-phase and quadrature-phase components utilizing a bypassable narrowband filter when the input carrier signal is the narrowband carrier signal;

a wideband filter, separate from the bypassable narrowband filter and connected in series with the bypassable narrowband filter, for filtering the input carrier signal when the input carrier signal is the wideband carrier signal and the bypassable narrowband filter is bypassed, wherein the bypassable narrowband filter is bypassed when a signal passes through but is not filtered by the bypassable narrowband filter; and a dual channel analog to digital converter (ADC) for:

digitizing the filtered and down-converted in-phase and quadrature-phase components;

adding digital gain if the input carrier signal is the wideband carrier signal; and outputting the digitized input carrier signal.

20. The satellite set-top box of claim 19, further comprising a demodulation processor for demodulating the in-phase and quadrature-phase components of the input carrier signal.

21. The satellite set-top box of claim 20, wherein the demodulation processor and the dual channel ADC are operatively connected via an 8-bit interface, and wherein the dual channel ADC comprises two 12-bit ADC cores.

22. The satellite set-top box of claim 21, wherein the dual channel ADC further comprises first and second 12-bit to 8-bit mapping modules for mapping the in-phase and quadrature-phase components of the input carrier signal to 8-bit digital data from 12-bit digital data.

* * * * *